United States Patent [19]

Lin et al.

[11] Patent Number: 5,242,780
[45] Date of Patent: Sep. 7, 1993

[54] ELECTROPHORETIC POSITIVE WORKING PHOTOSENSITIVE COMPOSITION COMPRISING AS THE PHOTOSENSITIVE INGREDIENT AN ALIPHATIC POLYESTER HAVING O-QUINONE DIAZIDE ON THE SIDE CHAIN AND END GROUPS

[75] Inventors: Hsien-Kuang Lin, Taipei; Jim-Chyuan Shieh, Miao Li; Dhei-Jhai Lin, Taoyuan, all of Taiwan

[73] Assignee: Industrial Technology Research Institute, Taiwan

[21] Appl. No.: 780,691

[22] Filed: Oct. 18, 1991

[51] Int. Cl.$^5$ .......................... G03F 7/023; G03F 7/32
[52] U.S. Cl. .................................... 430/190; 430/165; 430/168; 430/169; 430/191; 430/192; 430/193; 430/277; 430/318; 430/326; 430/910
[58] Field of Search .............. 430/190, 191, 192, 193, 430/165, 169, 326

[56] References Cited

U.S. PATENT DOCUMENTS

| | | |
|---|---|---|
| 3,647,443 | 3/1972 | Rauner et al. ............... 430/190 |
| 3,738,835 | 6/1972 | Bakos ............................ 96/36 |
| 4,028,111 | 6/1977 | Iwasaki et al. ............... 430/190 |
| 4,673,458 | 6/1987 | Ishikawa ....................... 430/318 |
| 4,681,923 | 7/1987 | Demmer ........................ 430/190 |
| 4,975,351 | 12/1990 | Akaki et al. ................. 430/192 |
| 5,055,374 | 10/1991 | Seio et al. .................... 430/165 |

FOREIGN PATENT DOCUMENTS

| | | |
|---|---|---|
| 0265387 | 4/1988 | European Pat. Off. . |
| 63-297473 | 12/1988 | Japan . |
| 1-4672 | 1/1989 | Japan . |
| 1-90270 | 4/1989 | Japan . |

*Primary Examiner*—Charles L. Bowers, Jr.
*Assistant Examiner*—John S. Chu
*Attorney, Agent, or Firm*—Townsend and Townsend; Khourie and Crew

[57] ABSTRACT

An electrophoretic positive working photosensitive composition for producing a photoresist pattern on metal base plate comprises a photosensitive compound, in which a photosensitive quinone diazide group is grafted on a polyester, and an acrylic copolymer containing carboxyl group, the composition forms a smooth photoresist film on the plate and has a good adhesion to the surface that no pinehole is found.

8 Claims, No Drawings

ELECTROPHORETIC POSITIVE WORKING PHOTOSENSITIVE COMPOSITION COMPRISING AS THE PHOTOSENSITIVE INGREDIENT AN ALIPHATIC POLYESTER HAVING O-QUINONE DIAZIDE ON THE SIDE CHAIN AND END GROUPS

BACKGROUND OF THE INVENTION

The present invention relates to an electrophoretic positive working photosensitive organic composition, and more particularly, it relates to an electrodeposition composition used in the coating of a metal base plate and forming a thin film thereon. After the exposure and the development of the thin film, it forms a pattern on the base plate which is suitably used in the production of polymeric patterns, especially the production of circuit patterns on printed circuit boards.

The most commonly used method in the production of printed circuit boards is the print and etch method. It is a method for forming a corrosion resisted pattern on a copper base plate which is totally electroplated with copper. The bare copper layer is removed by an etching solution, then a conductor is copied from the corrosion resisted pattern which is removed later by using a stripping solution. In the past, the method used to prepare a corrosion resisted pattern is the screen printing method wherein the transformation of the pattern is not all that definite, i.e. the resolution is low. In order to improve the resolution of the pattern, photoresist is applied so that the copper layer is firstly covered with photoresist and then exposed selectively in accordance with the conducting pattern on a film. The photoresist on the non-conductive part is removed by developer and therefore a corrosion resisted pattern is obtained. This method has a higher resolution than the screen printing method, and thus it has become an important method used in the production of printed circuit boards.

Photoresists used in production of printed circuit boards can be divided into two types, i.e. the liquid type and the dry film type. The coating methods used include for example dip coating, roller coating, spin coating and electrodeposition etc. Since the composition of the liquid photoresist is solubilized by a solvent, after coating, it should be dried before the following step is carried out. Although the compositions of the dry film photoresists are almost the same as the liquid state photoresists, the difference is that the dry film is protected by two upper and lower films a which film materials are polyester and polyethylene, and a copper surface is laminated with the photosensitive layer through the use of thermal compression. Therefore, the exposing step can be proceeded directly without the drying step.

According to the differences in the reacting mechanisms of exposure, photoresists can be divided into positive working and negative working photoresists. The positive working photoresists, wherein the photosensitive compound produces carboxyl groups during the exposure a have a higher higher solubility in an alkaline exposing solution, and thus the pattern is achieved or completed by using this characteristic. For a negative working photoresist, photocuring takes place on the exposed part. Since the cured part is insoluble in an alkaline developing solution, a corrosion resisted pattern is then produced. Negative working photoresists are commonly used in the industry of printed circuit boards.

In the production of multi-layered printed circuit boards, it is hard work to produce a plated through hole, and the common methods used are the pattern plating method and the tenting process. The reliability of the pattern plating method is high but the method is too complicated. On the other hand, the process for tenting is less complicated, but there is a problem with oxygen inhibition inside the hole when using a dry film photoresist so that the degree of curing is not enough. As a result, the photoresist on the tent is easily destroyed by spraying of developing solution, and thus, the reliability of this method is decreased.

An electrophoretic positive working photoresist is uniform in the thickness of the film so that it can cover the whole plated through hole. Since the hole does not require an exposure, the oxygen inhibition problem will not happen. In addition, positive working photoresists are a kind of aqueous emulsion and therefore a lesser amount of organic solvent is used. Additionally the waste is lower when a positive photoresist is used. As a result, it is a kind of potential new material.

Electrodeposition is applied in the coating of photoresist, for example, U.S. Pat. No. 3,738,835 discloses a coating on a metal plate by using a negative working photoresist composition. Furthermore, since the electrophoretic positive working photoresist is advantageous in the coating of a plated through hole, different kinds of photosensitive compositions are disclosed in some patents. For example Japan Laid-Open Patent No. 88-297474 discloses a composition containing a maleic copolymer, Japan Laid-Open Patent No. 89-4672 and No. 89-90270 disclose a composition containing an acrylic copolymer, and U.S. Pat. No. 4,681,923 discloses a composition containing a novolak resin. In the photosensitive groups of the above mentioned patents, photosensitive quinone diazide is grafted on a charge carrying polymer. Quinone diazide reacts with a little amount of water in photoresist after exposure, and then it converts into carboxyl group so that the exposing part is soluble in alkaline developer. For these single component photoresists, the photosensitive groups are immobilized on the side chains of a polymer, which results in a decrease in reactivity and photosensitivity. In addition, a pinhole is formed since the thermal fluidity of a single component photoresist is not good. On the other hand, photosensitive quinone diazide can also be attached or bonded to a small uncharged molecule. For example U.S. Pat. No. 4,673,458 and European Patent No. 0,265,387 disclose the bonding of quinone diazide on 2,4-dihydroxybenzophenone or 2,3,4-trihydroxybenzophenone. Although this method can improve the photosensitivity of the photosensitive groups, the groups are hydrophobic and precipitates are easily formed in emulsion solution such that a problem of the stabilization of electrodeposited photoresist solutions. As a result, the surface of photoresist film is rough and, in turn, reduced the resolution.

SUMMARY OF THE INVENTION

It is therefore an object of the present invention to provide an electrophoretic positive working photosensitive composition having good photosensitivity.

It is another object of the present invention to provide an electrophoretic positive working photosensitive composition which maintains the emulsifying stability of the electrodeposited photoresist solution so that no precipitate will form during the electrodepositing process.

It is still another object of the present invention to provide an electrophoretic positive working photosensitive composition having excellent resolution.

In order to achieve the objects stated above, the present photosensitive composition comprises a resin, in which a photosensitive quinone diazide group is bonded to a polyester polyol, and a charge carrying acrylic copolymer containing carboxyl groups. This photosensitive composition is dispersed in water in the form of an emulsion. It has been found that the present photosensitive composition has a strong adhesion to a copper plate which solves the problem of pinholes. It has further been discovered that this photosensitive composition has improvements in photosensitivity and stability.

DETAILED DESCRIPTION OF THE INVENTION

The present invention relates to a positive working photosensitive composition which is used in electrodepositing coating. The main components of the composition are an acrylic copolymer containing carboxyl groups and a quinone diazide containing resin which remains as emulsified particles in the water solution. The carboxyl groups of the acrylic copolymer are neutralized by small molecular amines, so as to make the acrylic copolymer form an anionic polymer that stabilize the existence of the emulsified particles in the water phase. The acrylic copolymer is synthesized from unsaturated monomers including carboxy bearing monomers and some other unsaturated monomers. The carboxy bearing monomers include methacrylic acid, acrylic acid, phthalic acid (meth)acrylate, succinic acid (meth)acrylate, itaconic acid, cinnamic acid, crotonic acid, maleic acid and beta-carboxyethyl (meth)acrylate etc. Other unsaturated monomers are selected from hydroxy bearing monomers (e.g. hydroxyethyl (meth)acrylate etc.), alkyl (meth)acrylate (e.g. methyl (meth)acrylate, butyl (meth)acrylate etc.), amide bearing monomers (eg. (meth)acrylamide, diacetone acrylamide etc.), nitrile bearing monomers (e.g. acrylonitrile etc.), amino bearing monomers (e.g. N,N-dimethyl amino ethyl (meth)acrylate, N,N-diethyl amino ethyl (meth)acrylate etc.) and aromatic monomers (e.g. benzyl acrylate, phenoxy acrylate etc.). The above-mentioned unsaturated monomers can be used independently or together to synthesize a copolymer with the carboxy bearing acrylic monomers.

In order to stabilize the emulsion solution and maintain the developing properties of photoresist film, the amount of the carboxy bearing monomers should constitute 3–30 wt % of the total amount of acrylic copolymer. The acrylic copolymer is synthesized from the free radical polymerization of the unsaturated monomers. The method used is suspension polymerization, emulsion polymerization or solution polymerization. The number average molecular weight of the copolymers should be controlled in the range of 2500–200,000.

The electric charges formed on the surface of emulsified particles are caused by the neutralization of the carboxyl groups of the copolymer and small molecular amines where the amines are selected from ammonium hydroxide, ethylamine, methyl ethylamine, diethylamine, methyl ethanolamine, diethanolamine, methyldiethylamine, triethylamine or triethanolamine etc. It is better to choose any less volatile amine, so as to prevent a trouble on the control of amine addition.

The backbone of the photosensitive quinone diazide containing resin is a polyester having quinone diazide group is attached to the terminal ends of the polyester chain, wherein the general formula of the polymer is:

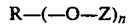

wherein R is a polyester having molecular weight of 100 to 2000;

Z is a group selected from the groups consisting of,

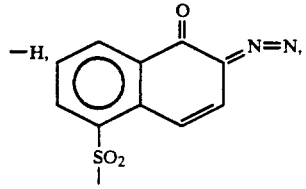

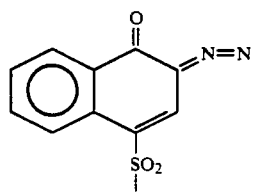

or

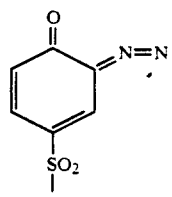

and at least one Z is selected from the group of

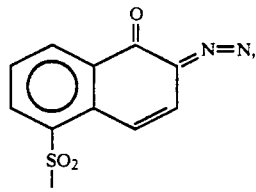

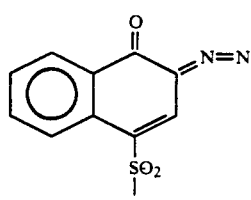

or

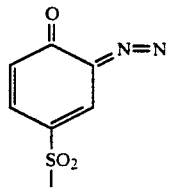

;and n is an integer equal to or larger than 2.

There are many methods which can be used to synthesize the photosensitive quinone diazide resin. The most suitable method is the esterification of polyester polyol with a quinone diazide sulfonyl halide. The polyester polyol can be obtained by buying or synthesis and the molecular weight should be less than 3000. A general synthesis used is the esterification of diols and diacids, wherein the by product water is removed by distillation during the synthesis. The diols used can be selected from the following ethylene glycol, propyleneglycol, 1,4-butanediol, diethyleneglycol, dipropyleneglycol, neopentylglycol, trimethylpentanediol, triethyleneglycol, 1,6-hexanediol or 1,3-butanediol, wherein neopentylglycol and trimethylpentanediol are soft polyesters having more side chains. Commonly used diacids are phthalic acid, isophthalic acid, adipic acid, oxalic acid, succinic acid and glutaric acid, therefor, the polyesters synthesized from oxalic acid, succinic acid and glutaric acid are unstable in water because of the occurrence of hydrolysis and therefore these diacids are seldom used. The end groups of the polyester polyol are hydroxyl groups, so the amount of diols used is always in excess during the reaction of diols and diacids.

Another type of polyester polyols is produced from the esterification between small molecular polyols and diacids, the product formed therefrom is a slightly branched polyesters. Suitable polyols include trifunctional alcohols, eg., glycerol, trimethylol ethane and trimethylol propane etc, and tetrafunctional alcohols, eg., pentaerythritol.

Open ring polymerization is also used to synthesize polyester polyols, for example, the combination of $\epsilon$-caprolactone and methyl-$\epsilon$-caprolactone with the suitable addition of polyols can produce polyesterdiol or polyestertriol and the like.

The suitable quinone diazide sulfonyl halides used in this invention are 1,2-naphthoquinone-2-diazide-5sulfonyl chloride, 1,2-naphthoquinone-2-diazide-4-sulfonyl chloride and 1,2-benzoquinone diazide-4-sulfonyl chloride etc. In the esterification of polyester polyol with quinone diazide sulfonyl halide, the ratio of mole equivalents for the hydroxyl group to sulfonyl halide is in the range of 1:0.3-1.

In the preparation of the electrodeposition composition, acrylic copolymers are well mixed with photosensitive quinone diazide resins by adding suitable amount of solvent, and subsequently the small molecular amines and deionized water are added to the mixture to control the pH value in the range of 7.0 to 8.5. The solid content of the mixture should be maintained within 5-20 wt %, and the weight ratio of the acrylic copolymers to the photosensitive quinone diazide resins should be 1:0.1-1.2.

The electrodeposition photosensitive solution prepared is poured into a electrodeposition tank. The metal base plate is placed at the anode and the cathode is connected to a stainless plate. The applied electrical voltage is in the range of 10 to 100 volts and the time taken for the electrodeposition is 0.5-5 minutes while the solution is circulated during the electrodeposition.

In the production of printed circuit boards a copper laminate is selected. The photosensitive composition is coated on a copper surface and it forms a photoresist film thereon. The copper laminate is then subjected to drying and other steps including exposure and development to form a pattern thereon. After the photoresist pattern is formed, the bare part of copper is removed by using an etching solution and the rest of photoresist film is then stripped off, and a copper conductor is therefore produced.

This invention is more specifically described by the following illustrative examples:

EXAMPLE 1

Preparation of acrylic copolymer I

A four-neck reaction flask was equipped with a condenser, a thermometer, a feeding tube and stirring rod. $N_2$ gas was introduced into the flask which was heated to 100° C. There was 110.0 g of diethyl ketone first added, and after about 10 minutes a mixed solution of 45.0 g of methyl methacrylate, 40.6 g of butylacrylate, 59.0 g of 2-hydroxyethylacrylate, 85.0 g of diacetone acrylamide, 7.2 g of acrylic acid and 3.0 g of N,N'-azobisisobutylnitrile was added dropwise, and the reaction was allowed to continue for 6 hours. The acrylic copolymer thus prepared had a molecular weight of 14,000.

EXAMPLE 2

Preparation of acrylic copolymer II

A four-neck reaction flask was equipped with a condenser, a thermometer, a feeding tube and stirring rod. $N_2$ gas was introduced into the flask which was heated to 100° C. There was 92.0 g of diethyl ketone first added, and after about 10 minutes a mixed solution of 38.0 g of methyl methacrylate, 64.0 g of butylacrylate, 50.0 g of 2-hydroxyethylacrylate, 43.0 g of methylacrylate, 11.5 g of methacrylic acid and 1.8 g of N,N'-azobisisobutylnitrile was added dropwise, and the reaction was allowed to continue for 6 hours. The acrylic copolymer thus prepared had a molecular weight of 21,000.

EXAMPLE 3

Preparation of acrylic copolymer III

A four-neck reaction flask was equipped with a condenser, a thermometer, a feeding tube and stirring rod. $N_2$ gas was introduced into the flask which was heated to 100° C. There was 83.0 g of propylene glycol mono methyl ether first added, and after about 10 minutes a mixed solution of 90.0 g of methyl methacrylate, 115.2 g of butylacrylate, 43.2 g of succinic acid acrylate and 2.5 g of N,N'-azobisisobutylnitrile was added dropwise, and the reaction was allowed to continue for 6 hours. The acrylic copolymer thus prepared had a molecular weight of 19,000.

EXAMPLE 4

Preparation of photosensitive resin A

A four-neck reaction flask was equipped with a condenser, a thermometer, a feeding tube and stirring rod. There were 95.6 g of aliphatic polyester polyols (hydroxy equivalent was 239 g/equivalent, a product from King Industries), 80.6 g of 1,2-naphthoquinone-2-diazide-5-sulfonyl chloride and 250.0 g of acetone added to this flask, and stirred well. A mixed solution of 33.0 g of triethylamine and 150.0 g of acetone was then added dropwise in 1 hour and the temperature was maintained at 25° C. The esterification was allowed to continue for 6 hours. The reaction product was poured into a 1% hydrochloric acid solution, stirred and separated to obtain a yellow brown resinous precipitate. The resulting precipitate was washed with deionized water and 167.2 g of yellow brown resin was obtained.

EXAMPLE 5

Preparation of photosensitive resin B

A four-neck reaction flask was equipped with a condenser, a thermometer, a feeding tube and a stirring rod. There were 48.8 g of aliphatic polyester polyols (hydroxy equivalent was 244 g/equivalent, a product from King Industries), 32.2 g of 1,2-naphthoquinone-2-diazide-5-sulfonyl chloride and 120.0 g of dichloromethane added to this flask, and stirred well. A mixed solution of 13.3 g of triethylamine and 50.0 g of dichloromethane was then added dropwise in 1 hour and the temperature was maintained at 25° C. The esterification was allowed to continue for 6 hours. The reaction product was poured into a 1% hydrochloric acid solution, stirred and separated to obtain a yellow brown solution. The resulting solution was washed with deionized water and was dried in a vacuum at 40° C. for 20 hours. There was obtained 76.2 g of yellow brown resin.

EXAMPLE 6

Preparation of photosensitive resin C

A four-neck reaction flask was equipped with a condenser, a thermometer, a feeding tube and a stirring rod. There were 150.0 g of poly(1,6-hexanediol-adipic acid) (hydroxy equivalent was 500 g/equivalent, AR-U-2610, product from Yong Chuan Company), 72.5 g of 1,2-naphthoquinone-2-diazide-4-sulfonyl chloride and 280.0 g of dichloromethane added to this flask, and stirred well. A mixed solution of 27.3 g of triethylamine and 200.0 g of dichloromethane was then added dropwise in 1 hour and the temperature was maintained at 25° C. The esterification was allowed to continue for 6 hours. The reaction product was poured into 1% hydrochloric acid solution, stirred and separated to obtain a yellow brown solution. The resulting solution was washed with deionized water and was dried in a vacuum at 40° C. for 20 hours. There was obtained 201.1 g of yellow brown resin.

EXAMPLE 7

There was 20.0 g of photosensitive resin A completely dissolved in 15.0 g of propylene glycol mono methyl ether, 67.6 g of acrylic copolymer I (the solid content was 69%) was then added. Triethylamine and deionized water were added dropwise until the pH value reached 7.5 and the content of solid was diluted to 9% by adding deionized water. The emulsion thus prepared was poured into a electrodeposition tank that a copper laminate was connected to the anode and 30 V current was applied for 2 minutes. The copper laminate was taken out and baked at 100° C. for 5 minutes to obtain a 5 microns photoresist film. This film was exposed to a UV radiation having an energy of 350 mJ/cm$^2$ and the exposed part of photoresist film was developed by using 1% sodium metasilicate. The developing time was 60 seconds and a clear photoresist pattern was formed on the copper laminate. Then, the bare part of copper foil was removed by a etching solution of cupric chloride and a board bearing circuit pattern was obtained. Neither peeling of the photoresist film nor pinholes were observed after this etching. On the other hand, no precipitation or change occurred after the emulsion was placed for two weeks and this shown that the emulsion had a good emulsifying stability.

EXAMPLE 8

There was 26.0 g of photosensitive resin B dissolved completely in 21.0 g of ethylene glycol mono butyl ether, 52.0 g of acrylic copolymer II (the solid content was 69%) was then added. Triethanolamine and deionized water were added dropwise until the pH value reached 7.7 and the content of solid was diluted to 9% by adding deionized water. The emulsion thus prepared was poured into a electrodeposition tank and a copper laminate was connected to the anode, then 30 V current was applied for 2 minutes to obtain a 6 microns smooth photosensitive film. This film was exposed to a UV radiation having an energy of 350 mJ/cm$^2$. The exposed part of the film was developed by using 1% sodium metasilicate solution. The developing time was 60 seconds and a clear photoresist pattern was formed on the copper laminate. After etching, neither peeling of the photoresist film nor pinholes were observed. Also, no precipitation or change occurred after the emulsion was placed for two weeks and this shown that the emulsion had a good emulsifying stability.

EXAMPLE 9

There was 34.0 g of photosensitive resin C completely dissolved in 25.0 g of propylene glycol mono methyl ether, 55.4 g of acrylic copolymer III (the solid content was 75%) was then added. Triethylamine and deionized water were added dropwise until the pH value reached 7.8 and the content of solid was diluted to 10%. The emulsion thus prepared was poured into a electrodeposition tank and a copper laminate was connected to the anode, then 35 V current was applied for 2 minutes. The copper plate was taken out and baked at 100° C. for 5 minutes to obtain a 8 microns smooth photoresist film. This film was exposed to a UV radiation having an energy of 350 mJ/cm$^2$. The exposed part of the film was developed by 1% sodium metasilicate solution. The developing time was 60 seconds and a clear photoresist pattern was formed on the copper laminate. The bare part of copper laminate was then removed by etching solution of cupric chloride. After etching, neither peeling of the photoresist film nor pinholes were observed. Also, no precipitation or change occurred after the emulsion was placed for two weeks and this shown that the emulsion had a good emulsifying stability.

COMPARATIVE EXAMPLE

There were 5.0 g of 2,3,4-tri(1,2-naphoquinone-2-diazide-5-sulphonyloxy)benzophenone, 5.0 g of ethylene glycol mono methyl ether and 36.2 g of acrylic copolymer I (the solid content was 69%) dissolved and mixed well. Triethylamine and deionized water were added dropwise until the pH value was 7.5 and the content of solid was diluted to 9% by adding deionized water. Precipitation was found in the bottom of the emulsion and the precipitate was 2,3,4-tri(1,2-naphoquinone-2-diazide-5-sulphonyloxy)benzophenone. So, the surface of electrodepositing film was rough and can not be used as a photoresist film.

According to the above examples, the present invention can provides a smooth photoresist film since the photosensitive resin is synthesized from a soft polymer, i.e. polyester polyol, and the photosensitive resin is soluble to some solvents and acrylic copolymer. Furthermore, the emulsion solution is good in stability that no precipitate formed even after few weeks. In addition, the photosensitivity of the present composition is higher than the prior art. In conclusion, the present invention relates to an electrophoretic positive working photosensitive composition which can solves the problem of pinholes, improves the adhesion between the film and the copper plate and promotes the resolution of the photoresist pattern.

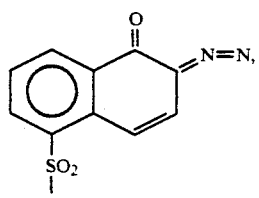

What is claimed is:

1. A positive working photosensitive composition which is in the form of an emulsion solution comprising:

an acrylic copolymer containing carboxyl groups, which is a polymerization product of 3-30 mol % of carboxyl bearing monomers and 70-97 mol % of other unsaturated monomers, wherein at least one of said monomers is an acrylic monomer;

a photosensitive quinone diazide compound of general formula:

R—(—O—Z)$_n$ wherein

R is an aliphatic polyester polyol with the molecular weight between 100 to 2000;

Z is a group selected from the groups consisting of

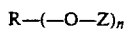, 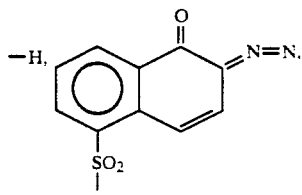

or

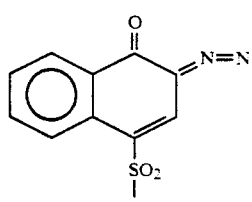

and at least one Z is selected from the group of

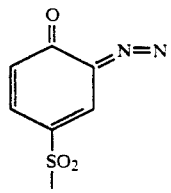

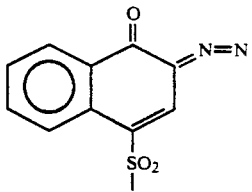

or

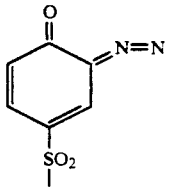

and n is an integer equal to or larger than 2; and water; wherein the solid content is 5-20%.

2. A positive working photosensitive composition as claimed in claim 1, wherein said carboxyl group of acrylic copolymer is neutralized with small molecular amine to form electric charges on the surface of emulsified particles.

3. A positive working photosensitive composition as claimed in claim 1, wherein said carboxy bearing monomer is selected from the group consisting of methacrylic acid, acrylic acid, phthalic acid (meth)acrylate, succinic acid (meth)acrylate, itaconic acid, cinnamic acid, crotonic acid, maleic acid or beta-carboxyethyl (meth)acrylate.

4. A positive working photosensitive composition as claimed in claim 1, wherein said other unsaturated monomer is selected from the group consisting of hydroxy bearing monomers, alkyl (meth)acrylate, amide bearing monomers, nitrile bearing monomers, amino bearing monomers or aromatic monomers.

5. A positive working photosensitive composition as claimed in claim 1, wherein said acrylic copolymer has a weight average molecular weight in the range of 3000-200000.

6. A positive working photosensitive composition as claimed in claim 1, wherein said photosensitive compound is a reaction product of the following compounds:

a hydroxyl group terminated polyester with the hydroxy equivalent weight between 100 to 1000; and a 1,2-quinone diazide sulfonyl halide; wherein the equivalent mole ratio of the hydroxyl group of said polyester to the 1,2-quinone diazide sulfonyl halide is 1:0.3-1.

7. A positive working photosensitive composition as claimed in claim 6, wherein said 1,2-quinone diazide sulfonyl halide is a compound selected from the group consisting of 1,2-naphthoquinone-2-diazide-5-sulfonyl chloride, 1,2-naphthoquinone-2-diazide-4-sulfonyl chloride or 1,2-benzoquinone diazide-4-sulfonyl chloride.

8. A positive working photosensitive composition as claimed in claim 1, wherein said n is an interger 2,3 or 4.

* * * * *